United States Patent [19]

Bruder

[11] 4,300,214
[45] Nov. 10, 1981

[54] CIRCUITRY FOR REDUCING PARASITIC COUPLING IN CORE MEMORY

[75] Inventor: John F. Bruder, Phoenix, Ariz.

[73] Assignee: Quadri Corporation, Tempe, Ariz.

[21] Appl. No.: 67,811

[22] Filed: Aug. 20, 1979

[51] Int. Cl.³ .................. G11C 7/02; G11C 11/06
[52] U.S. Cl. .................. 365/196; 365/209; 365/232
[58] Field of Search ............ 365/196, 206, 209, 214, 365/232, 243

[56] References Cited

U.S. PATENT DOCUMENTS

| | | | |
|---|---|---|---|
| 3,425,035 | 1/1969 | Bobeck | 365/206 |
| 3,693,176 | 9/1972 | Kenner | 365/209 |
| 3,982,233 | 9/1976 | Crookshanks | 365/196 |

*Primary Examiner*—James W. Moffitt
*Attorney, Agent, or Firm*—Cahill, Sutton & Thomas

[57] ABSTRACT

A core memory system includes an array of toroidal ferrite cores, and also includes two hundred fifty-six X lines extending through a plurality of the cores, one hundred twenty-eight Y lines extending through a plurality of the cores, and eighteen sense-inhibit lines, each extending through a respective plurality of the cores. The X lines are organized as 16 groups, the first ends of all X lines in each respective group being electrically connected together at a common junction. The common junction is connected to a first lead of a first winding of a Balun transformer. The Balun transformer includes 17 identical windings about a toroidal core. The second end of the first winding is connected to the output of an address driver/receiver circuit. The second ends of each of the 16 X lines are connected to the second leads of respective ones of the remaining 16 windings of the Balun transformer. The second leads of each of the 16 windings are connected to respective address driver/receiver circuits. In operation, one of the 16 X lines of the first group is selected by one of the driver/receiver circuits, whereby it acts as a current sink. The remaining 15 X lines of the first group are unselected by their corresponding address drivers, so that no current can flow in the remaining 15 X lines. A current pulse produced by the first driver/receiver circuit flows through the first winding of the Balun transformer, inducing an identical current in the Balun transformer connected to the selected X line. Since the current flowing into the selected X line and the current flowing out of the selected X line must be identical, no charging of parasitic capacitances coupling the selected X line to other lines in the core array can occur. Deleterious effects of such capacitive coupling are thereby obviated.

6 Claims, 5 Drawing Figures

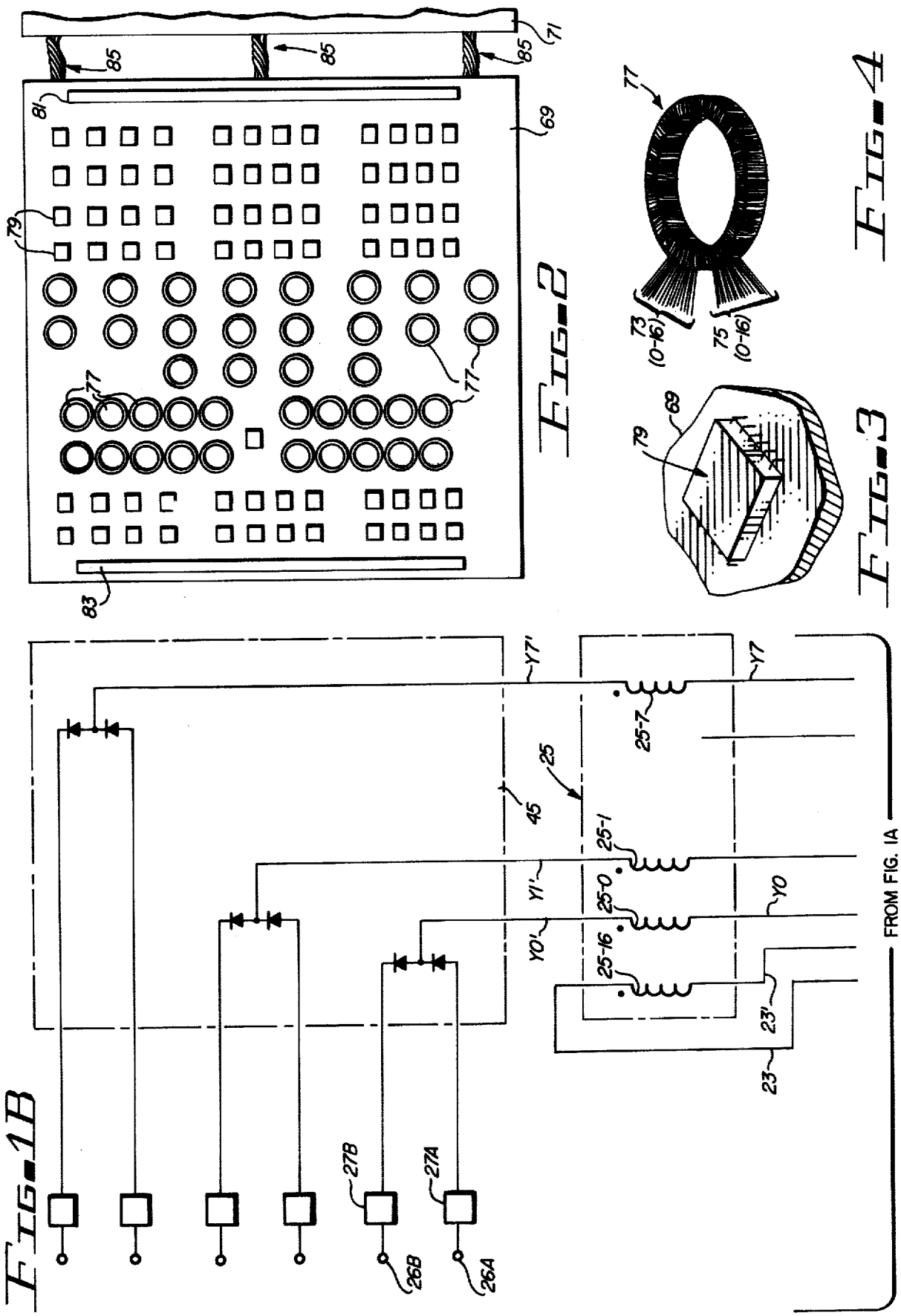

CIRCUITRY FOR REDUCING PARASITIC COUPLING IN CORE MEMORY

BACKGROUND OF THE INVENTION

1. Field of Invention

The invention relates to core memory systems, and more particularly to circuitry and methods for reliably addressing, reading, and writing data into very large, high density ferrite core arrays.

2. Description of the Prior Art

Random access memories composed of high density arrays of ferrite cores have been widely used, both in computer main frame memories and in a wide variety of other applications, especially applications where non-volatile memories are required and where memories are required to operate at very high and/or low temperatures. As the state of the art has progressed, numerous problems have been encountered in reliably manufacturing faster, larger, denser core memory systems. Although improved manufacturing techniques have made it possible to thread the necessary X and Y select conductors and sense/inhibit conductors through tiny toroidal ferrite cores to provide a high density core array containing over half a million bits on a single card having an area of roughly six to eight inches square, it has been extremely difficult and expensive to provide electronic addressing, writing, and sensing circuitry which can reliably address, sense, and write data into such a large, high density core array at the desired high operating speeds.

Accordingly, it is an object of this invention to provide a system and circuitry for addressing, sensing information in, and writing information into individual cores of a high density core array more reliably and less expensively than circuits and systems of the prior art.

Until now, in order to obtain a reliable system including a large, high density core array of as many as a half a million bits along with addressing, writing, and sensing circuitry, it has been necessary to individually, precisely, and laboriously match and balance various individual addressing, sensing, and writing circuit components in order to ensure reliable operation. This has greatly added to the cost of prior art high speed, high density core memory systems.

Accordingly, it is yet another object of the invention to provide method and circuitry for reliably accessing very high density core memory arrays without the necessity to individually trim and balance various circuit components of the addressing, sensing, and writing circuitry.

The main cause of difficulties experienced in reliably accessing extremely high density core memory arrays has been the presence of a large amount of capacitive coupling between the various X, Y, and sense/inhibit lines passing through the various ferrite cores in the array. Although the large, high density core arrays can lead to low cost and high speed performance, the amount of such capacitive coupling also increases as size of core diminishes, allowing the spacings between the various lines to decrease. Further, the amount of capacitive coupling between lines increases as the lengths of the various lines increases. The parasitic coupling between the sense/inhibit lines and the respective X and Y select lines is especially deleterious in extremely high density core arrays. Such parasitic capacitive coupling between the X or Y select lines and the sense/inhibit conductors can cause large voltages to be coupled to the sense/inhibit line during write operations, thereby causing undesired data to be written into "half-selected" cores. This, of course, is completely intolerable.

Accordingly, still another object of the invention is to provide circuitry and method for accessing high density ferrite core arrays in such a manner as to avoid capacitive coupling between the various conductors threaded throughout the core array.

A novelty search directed to the invention described herein uncovered the following patents, which are believed to be generally indicative of the state of the art for core memory systems: U.S. Pat. Nos. 3,693,176; 3,419,856; 3,671,951; 3,568,168; 3,510,853; 3,540,015; 3,524,175; 3,069,662 and 3,127,600.

BRIEF DESCRIPTION OF THE DRAWINGS

FIG. 2 is a top view illustrating a circuit board containing a plurality of the Balun transformers and diodes of the circuitry shown in FIGS. 1A and B.

FIG. 3 is a perspective view of one of the diode array circuit packages installed on the circuit board of FIG. 2.

FIG. 4 is a perspective view of one of the Balun transformers marked on the circuit board of FIG. 2.

SUMMARY OF THE INVENTION

Figure 1A:
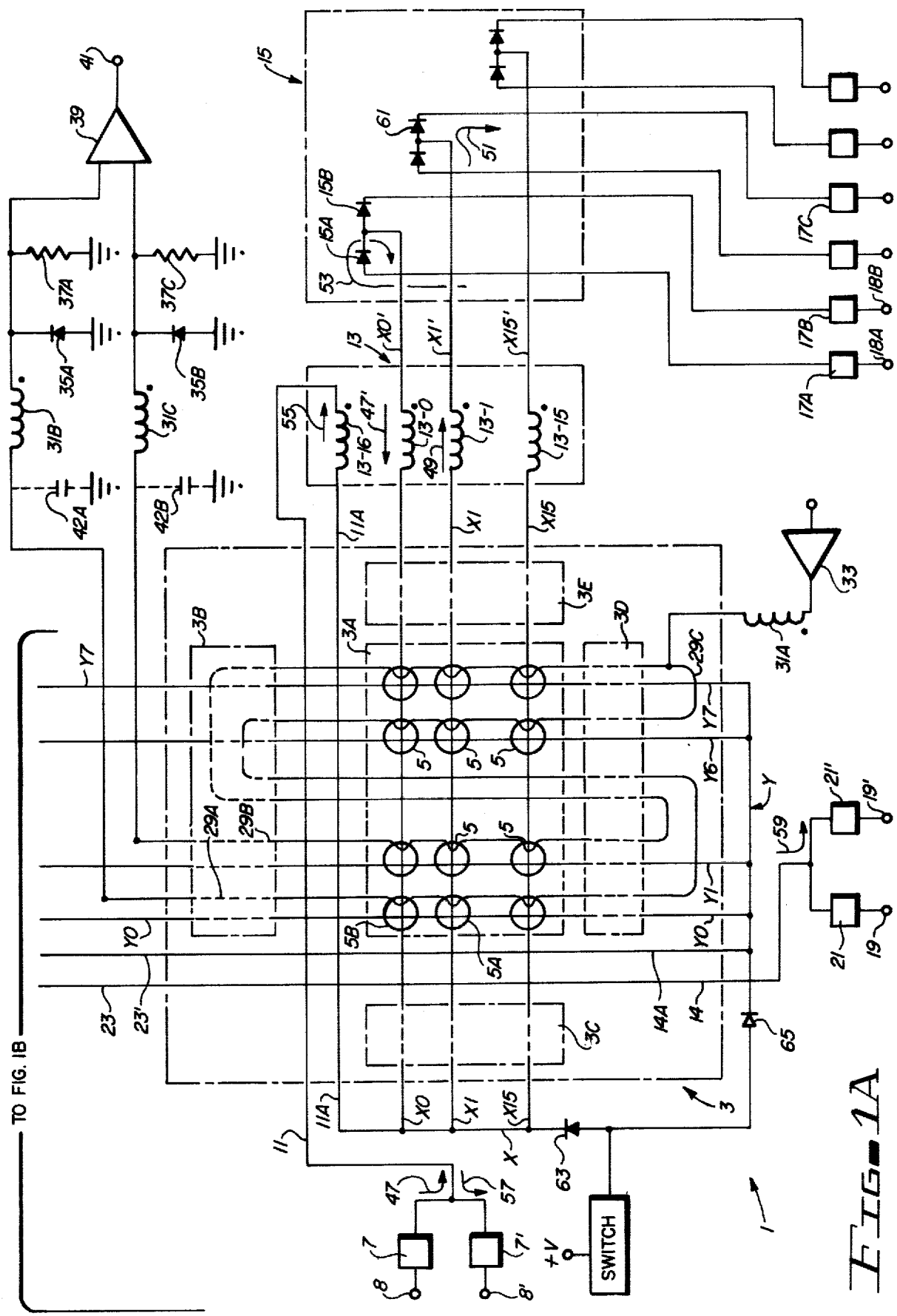
FIGS. 1A and B constitute a partial schematic drawing of the core memory system of the present invention.

Briefly described, and in accordance with one embodiment thereof, the invention provides circuitry and method for reducing parasitic capacitive coupling in a core memory system by forcing identical currents to flow in and out of opposite ends of select lines extending through a core memory array of the core memory system. A Balun transformer having a plurality of identical windings wound about a toroidal ferrite cores are utilized to force a current out of one end of a selected conductor, which current is equal to the current forced into the opposite end of the select conductor by a memory current driver circuit. The windings of the Balun transformer all have corresponding first leads and second leads. The first lead of a first winding of the Balun transformer is connected to the output of a current driver circuit. The second lead of the first winding is connected to the first end of a selected select conductor. The second lead of a second winding of the Balun transformer is connected to the second end of the selected select conductor. The first lead of the second winding is coupled to a current receiver circuit. In operation, a half-select current pulse produced by the driver circuit flows through the first winding, inducing a magnetic flux in the toroidal ferrite core of the Balun transformer. The magnetic flux produces a current in the second winding identical in magnitude to the current in the first winding, thereby causing current flowing out of the second end of the selected select conductor to be identical to the current flowing into the first end thereof. Consequently, no current is available to charge parasitic capacitances associated with the selected select conductor. Capacitive coupling between other conductors and the selected select conductor is thereby obviated. More particularly, capacitive coupling between the selected select conductor and sense/inhibit conductors extending through the memory core array is avoided. This avoids coupling of voltages to the sense/inhibit conductors resulting in undesired writing of data into half-selected cores.

In the described embodiment of the invention, groups of X-select conductors are joined to a common conductor connected by means of one winding of a Balun transformer to memory driver/receiver circuitry. Opposed ends of the respective X-select conductors are coupled by means of other windings of that Balun transformer, respectively, to other memory driver/receiver circuitry. Y-select conductors extending through the core array are similarly coupled to memory line driver/receiver circuitry by means of Balun transformers.

In one embodiment of the invention, Balun transformers are also utilized to insure that inhibit currents through each pair of sense/inhibit lines are split equally between the sense/inhibit conductors of each pair.

DESCRIPTION OF THE INVENTION

Referring now to FIGS. 1A and 1B, core memory system 1 includes a very high density array 3 of toroidal ferrite cores through which a plurality of X select lines, Y select lines, and sense/inhibit lines are threaded in a well known manner. Core array 3 contains over half a million ferrite cores on a single card measuring approximately six inches by eight inches. The X select, Y select, and sense/inhibit lines are very fine copper conductors.

Other circuitry shown in FIGS. 1A and 1B includes address selection circuitry and sense/inhibit circuitry. The address selection circuitry includes a plurality of X address drivers, such as 7, and plurality of Y address drivers, such as 21, a plurality of X Balun transformers 13, a plurality of Y Balun transformers such as 25, a plurality of X diode arrays such as 15, and a plurality of Y diode arrays such as 45. It should be noted that the term "memory drivers" includes both a category of circuits which are line drivers or current source circuits and a category of circuits which are line receivers or current sink circuits.

Also included in the core memory system 1 are a plurality of inhibit drivers 33, a plurality of Balun transformers, each having three windings such as 31A, 31B and 31C, and plurality of pairs of sense/inhibit conductors such as 29A, 29B joined together at one end 29C, their other ends leading to the inputs of a respective sense amplifier such as 39.

In a present embodiment of the invention, system 1 includes 256 X select conductors threaded through the core array 3, 128 Y select conductors also threaded through the core array 3, and 18 pairs of sense/inhibit conductors, corresponding to 18 bits of a word stored in core array 3. Thus, the memory is organized as 32,768 words by 18 bits, a total of 589,824 memory bits.

The description of the invention will be best understood after a very brief introduction to operation of a typical core memory system and the terminology commonly used. As is well known in the art, selection of a particular memory bit or core requires coincidence of current pulses passing through X and Y select conductors which pass through the selected core. A sense current is produced in a sense-inhibit conductor which passes through the selected core. During write or rewrite operations (which are necessary because "reading" of data stored in a ferrite core destroys the data), selection by again applying a current pulse, this time referred to as a write pulse, in the opposite direction through X and Y select conductors which pass through the selected core. The data written into the selected core depends upon whether or not a current pulse is driven into the sense/inhibit conductor (which passes through the selected core) by means of an inhibit driver circuit.

The currents driven into the X and Y select conductors, i.e., the read select pulses and the write select pulses, are referred to as "half-select currents". When a particular core said to be selected or "full selected" when both the X and Y select conductor threaded through that core have half select currents therein.

Referring still to FIGS. 1A and 1B, core array 3 includes a plurality of toroidal ferrite cores 5. The memory array is arranged as 32,768 words of 18 bits each. 256 X-select conductors are each threaded through eight various cores in core array 3. 128 Y-select conductors are also threaded through various cores in core array 3. The cores are arranged in 18 groups of 32,768 cores each. Each group of 32,768 cores is arranged as a 256 by 128 bit sub-array. Each X conductor, such as conductors X0, X1–X15, etc., extends through the 128 cores in a particular row of each of the 18 subarrays. Each of the 128 Y conductors, such as Y0, Y1–Y7, etc., extends through each of the 256 cores of a corresponding column of each of the 18 subarrays. Several of the 32,768 bit subarrays are indicated by reference numerals 3A, 3B, 3C, 3D and 3E.

The 256 X-select conductors are arranged in 16 groups of 16 conductors each. FIG. 1A shows one such group, including X conductors X0, X1–X15, all of which are connected together to common conductor 11A. Common conductor 11A is connected to the "undotted" terminal of winding 13-16 of a 17-winding Balun transformer 13. Balun transformer 13 has 16 other windings, namely 13-1, 13-2–13-15, which are identical to winding 13-16. Balun transformers are well known in the art and include a plurality of windings formed about a single toroidal ferrite core. FIG. 4 illustrates a typical Balun transformer.

The dotted terminal of winding 13-16 is connected to conductor 11, which is connected to memory driver circuitry 7. Memory driver/receiver circuitry 7 can be implemented by means of SN55326 and SN55327 monolithic integrated quadruple memory drivers, manufactured by Texas Instruments. The memory drivers can be controlled by means of address inputs to function either as a current source or a current sink. Their operation and structure are very familiar to those skilled in the core memory art, and need not be described in detail herein.

X-select lines X0–X15, after passing through the appropriate cores 5, as described above, are respectively connected to the undotted terminals of Balun transformer windings 13-0, 13-1,–13-15, respectively. The dotted terminals of windings 13-0, 13-1,–13-15 are connected, respectively, to conductors X0', X1'–X15', respectively, each of which is connected to diode array 15.

For example, conductor X0' is connected to the anode of diode 15B, the anode of which is connected to memory driver circuit 17B. Memory receiver circuit 17B can function as a current sink in response to its inputs 18B. Conductor X0' is also connected to the cathode of diode 15A, the anode of which is connected to the output of memory driver circuit 17A. Memory driver circuit 17A can function as a current source in response to its inputs 18A. It can be seen that conductors X1'–X15' are similarly connected.

The Y-select conductors Y0, Y1, etc., are similarly grouped and connected. The 128 Y-select conductors are grouped into 16 groups of 8 each. FIG. 1A illustrates a single 8 bit group designated by reference letter Y, including Y select lines Y0, Y1-Y7, which are connected together to conductor 14A. Conductor 14A is connected to the undotted terminal of winding 25-16 of 9 winding Balun transformer 25. The dotted terminal of winding 25-16 is connected to conductor 14, which is connected to the outputs of memory driver/receiver circuit 21. Memory driver/receiver circuit 21 is essentially similar to memory driver circuit 7, described above.

Each of Y-select conductors Y0, Y1-Y7 extends through the respective columns of cores 5, as explained previously, and is connected to the undotted terminal of a respectively one of windings 25-0, 25-1-25-7 of Balun transformer 25. The dotted terminals of each of windings 25-0, 25-1-25-7 are connected to conductors Y0', Y1'-Y7', respectively. Each of conductors Y0'-Y7' are connected to a diode pair in diode array 45 in the same manner that conductors X0'-X15' are connected to the diode pairs in diode array 15, as previously explained.

Still referring to FIGS. 1A and 1B, a pair of sense/inhibit conductors 29A and 29B extend in a parallel serpentine fashion through adjacent groups of cores, so that one of sense/inhibit conductors 29A or 29B passes through every core corresponding to one bit of the 32,768 word by 18 bit memory in system 1.

Sense/inhibit conductors 29A and 29B are joined at end 29C to form a continuous U-shaped path. End 29C is connected to the undotted terminal of Balun transformer winding 31A, the dotted terminal of which is connected to the output of inhibit driver 33. Inhibit driver 33 can be any ordinary memory driver and can be readily selected by those skilled in the art from the wide variety of such circuits which are commercially available. Balun transformer winding 31A is wound about the same toroidal ferrite core as windings 31B and 31C. The opposite ends of sense/inhibit conductors 29A and 29B are connected, respectively, to the undotted terminals of windings 31B and 31C. The dotted terminals of windings 31B and 31C are connected, respectively, to the inputs of sense amplifier 39, which produces a data output signal at conductor 41. Sense amplifier 39 can be readily selected by those skilled in the art from a wide variety of commercially available core memory sense amplifiers. Resistors 37A and 37C, which may have resistances of 100 ohms, provide suitable line terminations for sense/inhibit conductors 29A and 29B.

As previously briefly explained, a particular core in system 1 is accessed for either reading information stored in that core or writing or rewriting information into that core. A particular core is accessed by driving two "half-select" currents, namely an X half-select current and a Y half-select current into the X and Y select lines which pass through the selected ferrite core.

For example, for a "read" operation from memory core 5B, driver 17A is turned on, forcing a current (which is typically 300 miliamperes) through diode 15A in the direction indicated by arrow 53 into conductor X0' and through Balun transformer winding 13-0. The 300 miliampere current flows through X-select conductor X0 into conductor 11A.

Since 300 miliamperes of current, the direction of which is indicated by arrow 53, flow through Balun transformer winding 13-0, an identical 300 miliampere current is forced to flow out of conductor 11A through Balun transformer winding 13-16 in the direction indicated by arrow 55. Thus, the same current is forced into conductor X0 by Balun transformer winding 13-0 as is drawn out of conductor X0 and led into current receiver circuit 7' by Balun transformer winding 13-16. (It should be noted that conductor X0 is "selected" by driver circuit 17A. The remaining X-select conductors X1, X2-X15 are not selected. Consequently, magnetic flux produced in the toroidal ferrite core of Balun transformer 13 induces voltages, rather than currents in windings 13-1, 13-2-13-15.) Consequently, the capacitive coupling currents flowing from conductor X0 into parasitic capacitances between conductor X0 and other conductors in core array 3 is negligible. Thus, parasitic capacitive coupling which is usually very harmful to circuit operation in large core memory stacks is obviated in accordance with the present invention by use of Balun transformer windings at opposite ends of the X-select conductors.

Precisely the same technique is used to "half-select" any one of the Y conductors as is used to "half-select" an X conductor, as described above. For example, to select Y-select conductor Y0, driver circuit 27A forces a 300 miliampere current through Balun transformer winding 25-0, thereby inducing an identical 300 miliampere current in Balun transformer winding 25-16, preventing any significant capacitive coupling between Y-select conductor Y0 and other conductors in the core array 3.

The memory core 3B at the intersection of select conductors X0 and Y0 is then selected, and a read current is induced in sense/inhibit conductor 29A, developing a sense voltage across resistor 37A. This voltage is differentially detected by sense amplifier 39.

The above mentioned 300 miliampere currents produced by Balun transformer windings 13-16 and 25-16 produce currents which flow into driver 7' and 21', as shown by arrows 57 and 59, respectively. Both of these circuits are Texas Instruments SN75326 memory driver circuit which operate as current sink circuits.

Next, a write (or rewrite) operation of writing data into memory core 5A will be described. In order to perform a write or rewrite operation, a 300 miliampere current is driven by driver circuit 7 into conductor 11, as indicated by arrow 47. Current receiver circuit 7' is, of course, turned off. The 300 miliampere current in conductor 11 flows through Balun transformer winding 13-16 in the direction indicated by arrow 47'. This causes current of 300 miliamperes to flow through Balun transformer 13-1 in the direction indicated by arrow 49. This forward biases diode 61, causing a 300 miliampere current to flow into current receiver circuit 17C, as indicated by arrow 51. Similarly, current driver circuit 21 forces the 300 miliampere current into conductor 14, through Balun transformer 25-16, and into conductor 23'. An identical 300 miliampere current is induced in Balun transformer winding 25-0, into conductor Y0' and into current receiver circuit 27B. Parasitic capacitive coupling from conductors Y0 and X1 is thereby avoided due to the fact that the currents flowing in and out of each select conductor passing through the memory stack are forced to be equal.

During the coincidence of the 300 miliampere currents through conductors Y0 and X1, inhibit driver circuit 33 produces a current pulse in sense/inhibit conductors 29A and 29B by acting as a current sink for currents which flow through diodes 35A and 35B into sense/inhibit conductors 29A and 29B, respectively. The absence of the inhibit current in sense/inhibit conductor 29A and the 300 miliampere half-select write currents in conductors X1 and Y0 causes a logical "zero" to be written into memory core 5A. The presence of the two 300 milliampere write current pulses and the inhibit current causes a logical "one" to be written into memory core 5A.

According to one embodiment of the invention, Balun transformer windings 31A, 31B and 31C improve circuit performance by causing equal inhibit currents to flow in sense/inhibit conductors 29A and 29B, and cause the current sink by inhibit driver 33 to be exactly equal to the sum of the two currents flowing into sense/inhibit conductors 29A and 29B through diodes 35A and 35B, respectively. This is accomplished because the number of turns of windings 31B and 31C is equal to the number of turns of winding 31A.

It should be noted that the improvement in operation of system 1 was greatly improved by the addition of the Balun transformers 13 and 25 connected as illustrated and as described above. Use of the Balun transformer 31A, 31B, 31C provides slight further improvements. The commercialized version of the system of FIGS. 1A and 1B omits use of the Balun transformer 31A, 31B, 31C in conjunction with sense/inhibit conductors 29A and 29B; however, this Balun transformer could be utilized in certain cases to provide somewhat improved memory performance and reliability.

Diodes 63 and 65 are utilized to initially precharge conductors X0–X15 and Y0–Y15, respectively, to decrease the currents required to be supplied by the memory driver circuits coupled thereto.

The diode arrays 15 and 45 can be readily provided by those skilled in the art. In the described embodiment of the invention, Fairchild FSA2500M diode arrays are utilized, and are packaged in packages of the type shown in FIG. 3.

The Balun transformers and diodes of FIGS. 1A and 1B are mounted on a circuit board in the manner shown in FIG. 2. Referring now to FIG. 2, a plurality of Balun transformers generally indicated by reference numeral 77 are mounted on one side of circuit board 69 in the manner generally indicated in FIG. 2. A plurality of diode arrays each mounted in a dual-in-line (DIP) ceramic or plastic package and generally indicated by reference numeral 79 are mounted on the same side of circuit board 69 as Balun transformer 77. The various leads of Balun transformer 77 and diode packages 79 extend through holes or vias in circuit board 69 and are connected on the opposite side of circuit board 69 in the manner indicated in FIGS. 1A and 1B. The connections to the various memory driver and receiver circuits shown in FIGS. 1A and 1B are made by means of connectors 81 and 83.

The previously mentioned memory core array 3 is fabricated on a circuit board 71. The connections of the Balun transformer 77 to the appropriate X-select and Y-select conductors and sense/inhibit conductors extending through core array 3 are accomplished by means of bundles of thin insulated copper wires. The bundles are generally designated by reference numeral 85 in FIG. 2. In a completed memory system, circuit cards 69 and 71 are "folded" together and rigidly mounted by means of end supports so that circuit cards 69 and 71 are parallel.

While the invention has been described with reference to a particular embodiment thereof, those skilled in the art will recognize that variations can be made to the illustrated and described embodiment of the invention without departing from the true spirit and scope of the present invention as set forth in the appended claims.

I claim:

1. A core memory system comprising in combination:
 (a) a plurality of memory cores, said cores being arranged in a plurality of core groups;
 (b) a first group of select conductors each having a first end and a second end and each being threaded through all of the cores of a respective one of said core groups, the first ends of all select conductors of said first group being connected together;
 (c) a first driver-receiver circuit and a first group of driver-receiver circuits;
 (d) a balun transformer having a first winding and a first group of windings equal in number to the number of select conductors of said first group, said first winding and each of said windings of said first group having substantially the same number of turns, said first winding and each winding of said first group having a first polarity terminal and a second polarity terminal; and
 (e) a sense-inhibit conductor threaded through all of said cores;
 the first polarity terminal of said first winding being coupled to said first driver-receiver circuit, the first polarity terminals of each of said windings of said first group being coupled to a respective driver-receiver circuit of said first group,
 the second polarity terminal of said first winding being connected to all of the first ends of said select conductors of said first group, the second polarity terminals of said windings of said first group being coupled to the respective second ends of said select conductors of said first group,
 the amount of a select current forced into one end of any of said select conductors being essentially equal to the amount of current forced to flow out of the other end of that select conductor, allowing no more than a negligible amount of parasitic current to charge parasitic capacitances coupling that select conductor to said sense-inhibit conductor and to other select conductors.

2. A core memory system comprising in combination:
 (a) a plurality of memory cores, said cores being arranged in a plurality of core groups, each core being included in two of said core groups;
 (b) a first group of select conductors each having a first end and a second end and each being threaded through all of the cores of a respective one of said core groups, the first ends of all select conductors of said first group being connected together;
 (c) a second group of select conductors each having a first end and a second end and each being threaded through all of the cores of a respective one of said core groups, the first end of all select conductors of said second group being connected together;
 (d) a first driver-receiver circuit, a second driver-receiver circuit, a first group of driver-receiver circuits, and a second group of driver-receiver circuits;
 (e) a first balun transformer having a first winding and a first group of windings equal in number to the number of select conductors of said first group, said first winding and each of said windings of said first group having substantially the same number of turns, said first winding and each winding of said first group having a first polarity terminal and a second polarity terminal;

(f) a second balun transformer having a second winding and a second group of windings equal in number to the number of select conductors of said second group, said second winding and each of said windings of said second group having substantially the same number of turns, said second winding and each winding of said second group having a first polarity terminal and a second polarity terminal; and (g) a sense-inhibit conductor threaded through all of said cores;

the first polarity terminal of said first winding being coupled to said first driver-receiver circuit, the first polarity terminals of each of said windings of said first group being coupled to a respective driver-receiver circuit of said first group, the second polarity terminal of said first winding being connected to all of the first ends of said select conductors of said first group, the second polarity terminals of said windings of said first group being coupled to the respective second ends of said select conductors of said first group, the first polarity terminal of said second winding being coupled to said second driver-receiver circuit, the first polarity terminals of each of said windings of said second group being coupled to a respective driver-circuit of said second group, the second polarity terminal of said second winding being connected to all of the first ends of said select conductors of said second group, the second polarity terminals of said windings of said second group being coupled to the respective second ends of said select conductors of said second group, the amount of a select current forced into one end of any of said select conductors being essentially equal to the amount of current forced to flow out of the other end of that select conductor, allowing no more than a negligible amount of parasitic current to charge parasitic capacitances coupling that select conductor to said sense-inhibit conductor and to other select conductors.

3. The core memory system of claim 2 wherein said driver-receiver circuits operate to source or sink approximately three hundred milliampere select currents.

4. The core memory system of claim 2 wherein said first and second balun transformers each have only seventeen windings.

5. The core memory system of claim 2 wherein each of said driver-receiver circuits of said first and second groups includes a pair of steering diodes for coupling that driver-receiver circuit to select lines.

6. The core memory system of claim 2 wherein said plurality of memory cores are disposed on a first board, and said first and second balun transformers and said balun transformers of said first and second groups and said first and second driver-receiver circuits and said first and second driver-receiver circuits of said first and second groups are disposed on a second board, conductors coupling said first and second boards being grouped in flexible bundles.

* * * * *